United States Patent
Menon et al.

(10) Patent No.: US 7,259,083 B2
(45) Date of Patent: Aug. 21, 2007

(54) LOCAL INTERCONNECT MANUFACTURING PROCESS

(75) Inventors: Santosh S. Menon, Troutdale, OR (US); Hemanshu D. Bhatt, Vancouver, WA (US); David Pritchard, Portland, OR (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 10/971,961

(22) Filed: Oct. 22, 2004

(65) Prior Publication Data

US 2006/0088990 A1    Apr. 27, 2006

(51) Int. Cl.
*H01L 21/3205*    (2006.01)

(52) U.S. Cl. ............... 438/586; 438/597; 257/E21.507; 257/E21.582; 257/E21.59

(58) Field of Classification Search ................ 438/597, 438/634, 586, E21.59; 257/E21.575, E21.582, 257/E21.507
See application file for complete search history.

(56) References Cited

U.S. PATENT DOCUMENTS

| | | | | |
|---|---|---|---|---|
| 4,997,790 A * | 3/1991 | Woo et al. | ................... | 438/586 |
| 5,902,132 A * | 5/1999 | Mitsuhashi | ................... | 438/666 |
| 6,093,629 A * | 7/2000 | Chen | ........................... | 438/597 |
| 6,197,639 B1 * | 3/2001 | Lee et al. | ................... | 438/258 |
| 6,207,543 B1 * | 3/2001 | Harvey et al. | ............... | 438/586 |
| 6,383,878 B1 * | 5/2002 | Huang | ......................... | 438/299 |
| 6,413,827 B2 | 7/2002 | Farrar | ......................... | 438/296 |
| 6,420,273 B1 * | 7/2002 | Lin | .............................. | 438/706 |
| 6,548,394 B1 * | 4/2003 | Peng et al. | .................. | 438/618 |
| 6,781,192 B2 | 8/2004 | Farrar | ......................... | 257/325 |
| 6,784,552 B2 * | 8/2004 | Nulty et al. | ................. | 257/774 |
| 6,803,318 B1 * | 10/2004 | Qiao et al. | ................... | 438/700 |
| 2002/0146897 A1 * | 10/2002 | Nulty et al. | ................. | 438/586 |
| 2003/0082900 A1 * | 5/2003 | Peng et al. | .................. | 438/618 |
| 2003/0113973 A1 * | 6/2003 | Chu | ............................ | 438/296 |

\* cited by examiner

*Primary Examiner*—Scott B. Geyer
*Assistant Examiner*—Stanetta Isaac
(74) *Attorney, Agent, or Firm*—Beyer Weaver LLP

(57) ABSTRACT

The present invention is directed to a method of fabricating a local interconnect. A disclosed method involves forming two separate cavities in the ILD above two electrical contacts of a transistor. A first cavity extend down to an underlying etch stop layer. The first cavity is then filled with a protective layer. The second cavity is then formed adjacent to the first cavity and extends down to expose the underlying etch stop layer. The protective layer is removed to form an expanded cavity including the first and second cavities which expose the underlying etch stop layer in the expanded cavity. The etch stop material in the expanded cavity is also removed to expose an underlying gate contact and expose one of a source or drain contact. The gate contact is then electrically connected with one of the exposed source or drain contacts to form a local interconnect.

10 Claims, 3 Drawing Sheets

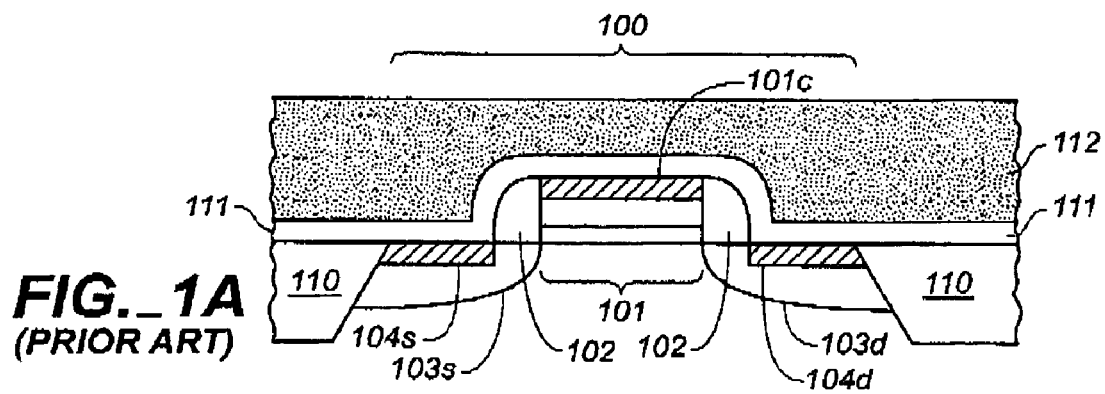
FIG._1A
(PRIOR ART)
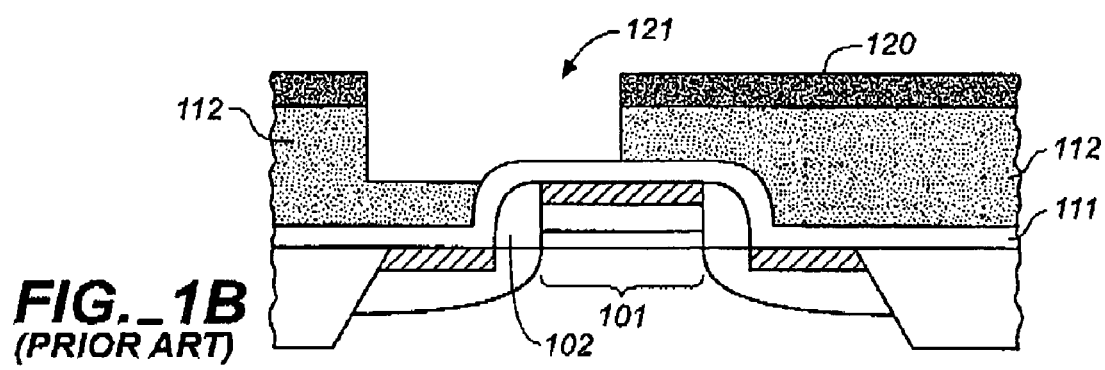
FIG._1B
(PRIOR ART)
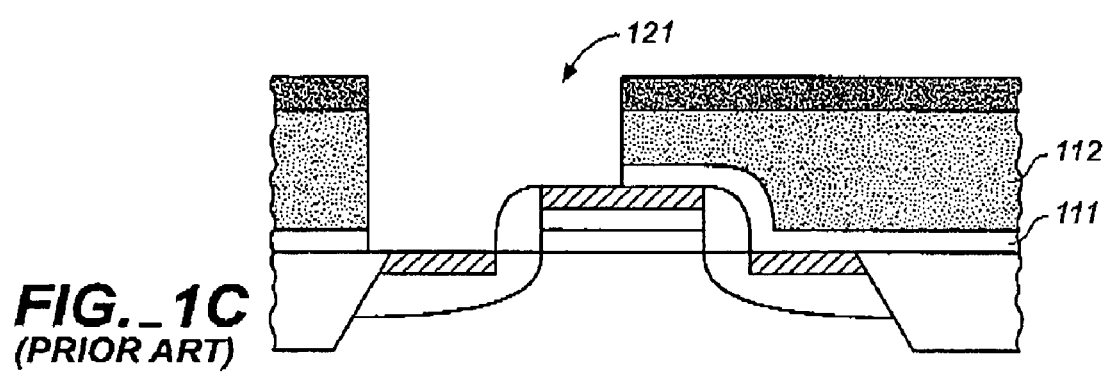
FIG._1C
(PRIOR ART)
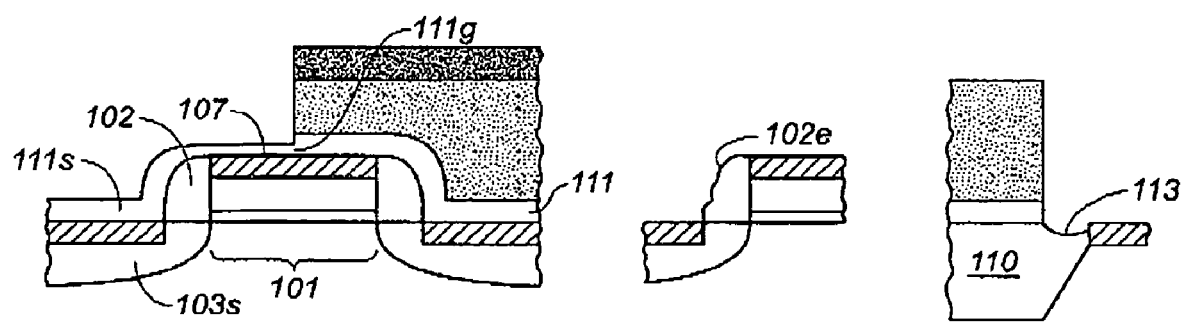
FIG._1D
(PRIOR ART)
FIG._1E
(PRIOR ART)
FIG._1F
(PRIOR ART)

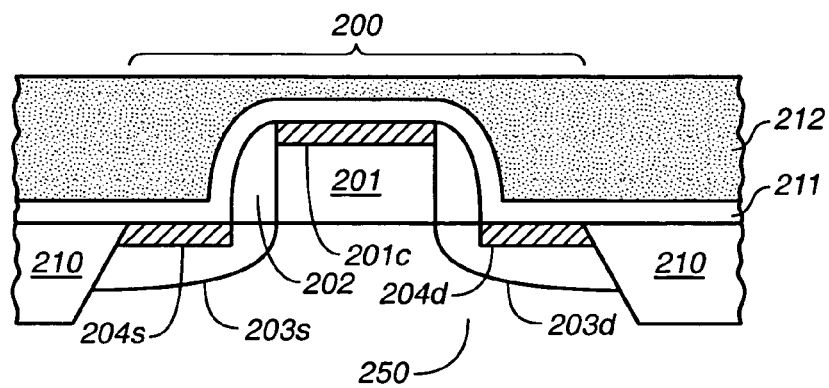
FIG._2
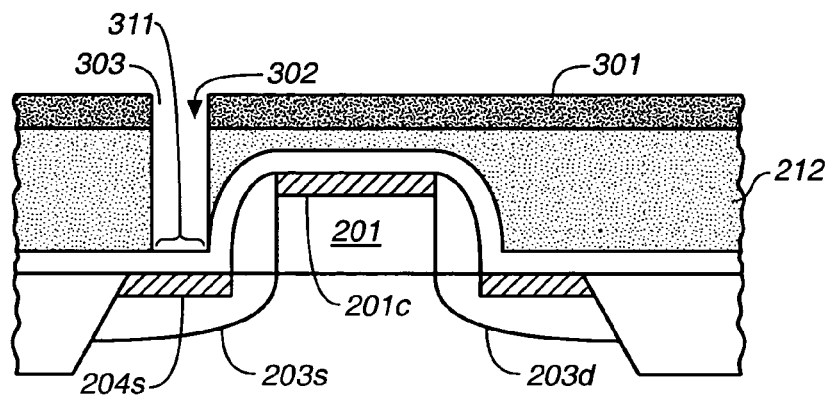
FIG._3
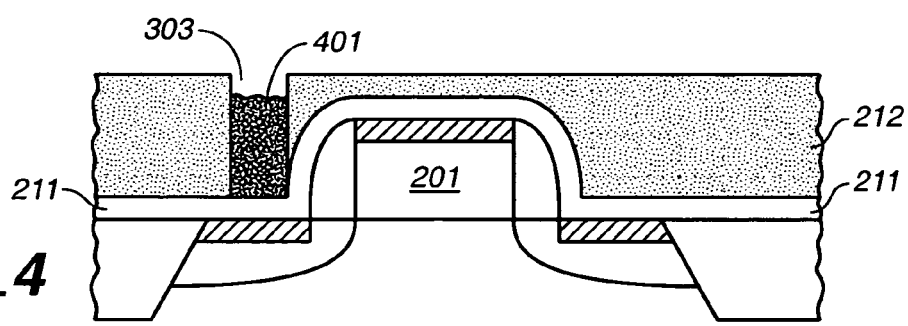
FIG._4
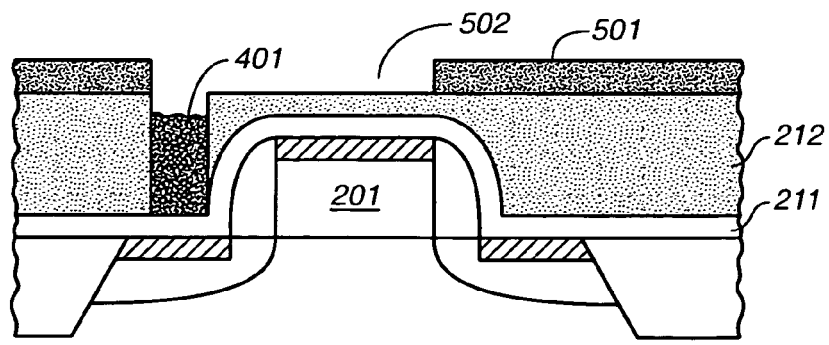
FIG._5

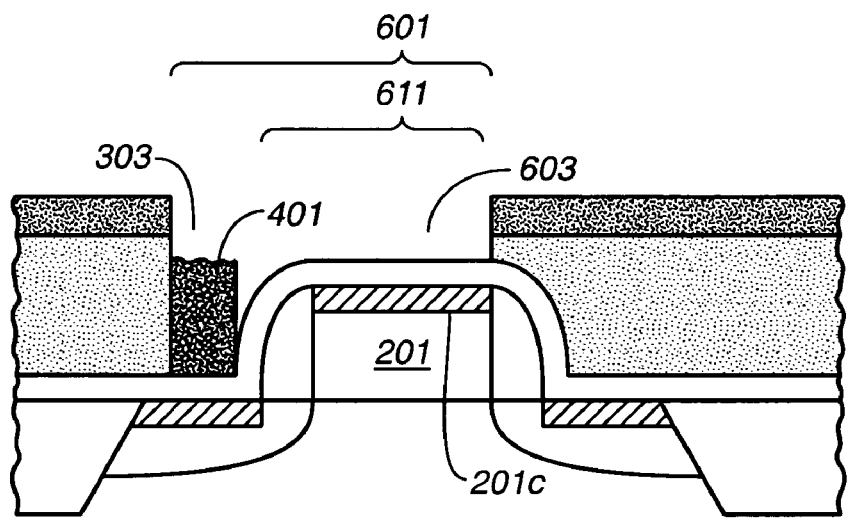
FIG._6
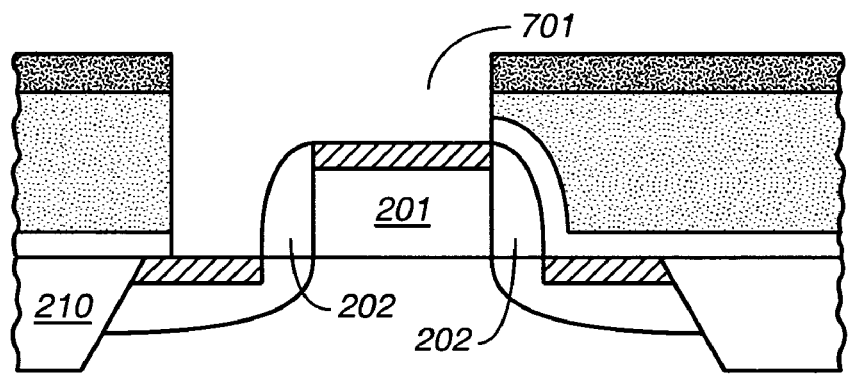
FIG._7
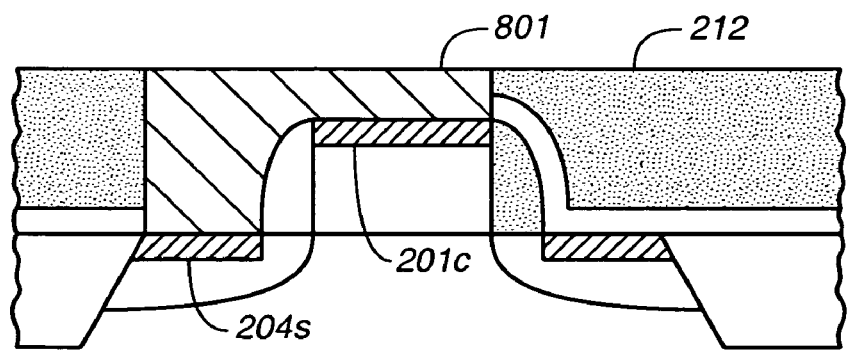
FIG._8

LOCAL INTERCONNECT MANUFACTURING PROCESS

FIELD OF THE INVENTION

The invention described herein relates generally to semiconductor devices and processing. In particular, the present invention relates to methods, materials, and structures used in forming local interconnects that electrically interconnect the gate regions of a transistor to local sources or drains.

BACKGROUND OF THE INVENTION

The fabrication and implementation of electronic circuits involves electrically connecting devices through specific electronic paths. In particular, very short intra-transistor circuit electrical paths are commonly formed. For example, a drain or source of a transistor can be electrically connected to the gate of the same transistor. Also, other very short path length electrical circuits are commonly formed. Short path length electrical connections are commonly referred to in the art as local interconnects.

Present processes for fabricating such local interconnects presents some problems which have not yet been successfully addressed in the industry. The following few diagrams illustrate some of the more significant problems identified in state of the art local interconnect manufacturing processes.

FIG. 1A is a simplified schematic depiction of a single transistor formed on a silicon wafer in accordance with the present state of the art. The following depicted process is a conventional process used to form a local interconnects structure. The depicted structure includes a wafer having a transistor 100 formed thereon. The transistor is generally isolated from other transistors and circuit structures on the wafer using isolation structures. In the depicted structure, the isolation is accommodated using shallow trench isolation (STI) structures 110. Also, the transistor and associated substrate are generally covered with one or more etch stop layers 111 which facilitate fabrication. Over the entire substrate is an inter-layer dielectric material 112, also known in the industry as an ILD.

Continuing with the description of FIG. 1A, the transistor 100 includes a gate portion 101 having a top gate contact 101c formed thereon. The gate contact 101c is configured to facilitate electrical contacts to the gate 101. Also, the gate 101 commonly has spacers 102 arranged on the sides to enhance electrical performance. Additionally, the transistor 100 includes a drain region 103d and a source region 103s, each of which include an associated electrical contact (104s and 104d respectively). To establish a local interconnect the gate 100 can, for example, be electrically connected with the source 103s. Such connection is typically achieved by electrically connecting the gate contact 101c with (in this case) the source contact 104s. FIGS. 1B, 1C, and 1D, 1E, 1F illustrate aspects of one conventional process for achieving this connection and some of the drawbacks of existing methodologies for its construction.

In order to establish such a local interconnect, portions of the ILD 112 and the etch stop 111 must be selectively removed. In one commonly employed conventional process (depicted by FIGS. 1B and 1C) a portion of the substrate is masked and then the surface is etched. For example, a photo resist layer 120 is patterned to include an opening 121 that will define the location of the local interconnect. A standard etch process (i.e., a plasma etch process) is used to remove the ILD 112. When the etch process reaches the etch stop layer 111 located over the gate 101, the etch process slows significantly over the gate 101. However, the etch process continues relatively unimpeded in the region over the source 103s. Unfortunately, the etch protection provided by the etch stop layer 111 is not perfect, and the etch stop layer 111 is eroded while the process removes the ILD 112. Thus, the etch stop layer 111 becomes thinner on top of the gate 101 and also in the regions near the top of the exposed spacer 102. These thickness variations lead to some significant process difficulties which were not as important when larger feature sizes were used (e.g., 1 micron technologies). However, for deep sub-micron feature sizes (e.g., for 0.18 micron CMOS technologies or smaller) certain process difficulties have a more pronounced effect on the resultant semiconductor structures.

FIG. 1C schematically depicts a simplified cross section view of a final etch profile resulting from a conventional process. The ILD 112 is removed in the opening 121. In a subsequent etch using an alternative chemistry, the etch stop layer 111 is also removed in the opening 121. However, as previously hinted at, the removal of the ILD 112 in one portion of the etched surface before the remainder of the ILD is removed means that while the remaining portions of the ILD layer are being etched away, the same etch process is working on the exposed etch stop layer 111. This leads to uneven erosion of the etch stop layer 111. Consequently, when the unevenly eroded etch stop layer 111 is etched away the substrate under the prematurely thinned etch stop layer 111 can be come damaged. This happens because the etch process is designed to remove all of the etch stop 111, including the thickest (un-eroded) layer of etch stop 111. However, where the etch stop has been previously eroded the etch process begins to etch the underlying layers. This is a very undesirable outcome. Additionally, circuit design and process technologies extend manufacturing technologies into the deep sub-micron range the processes become extremely sensitive to over etch problems. This is particularly problematic for feature sizes of less than 0.15 micron and especially so as process technologies extend below the sub 0.09 micron (90 nm) range.

FIGS. 1D, 1E, 1F illustrate some issues presented by conventional manufacturing processes used today. One difficulty is illustrated in the simplified depiction of FIG. 1D. As explained above, when the ILD is removed from the gate 101 some ILD remains above the source 103s. Therefore, when ILD etching continues to remove the ILD above the source 103s some of the etch stop layer 111 is removed in the uncovered regions. Thus, as shown, the etch stop layer 111 is thinner above the gate 101 and also above the spacer 102. In a conventional process, etch selectivity between the ILD etchant and the material comprising the etch stop layer 111 reduces this damage. However, due to ever shrinking critical dimensions even the relatively small damage done to the etch stop 111 during this ILD etch is significant enough to pose a serious problem. When the etch stop 111 is etched away, all of the thin portion 111g of the etch stop 111 will be gone, whereas some portion of the thicker layer 111s will remain. Subsequent etching will remove the rest of the thicker layer 111s, but, some portion of the substrate underlying the thin portion 111g of the etch stop 111 (here, for example, the source 103s and portions of the exposed spacer 102) will also be removed. This can have drastic effects of the performance of the resulting circuit. For example, the gate electrode 107 can be etched resulting in serious fluctuations in the gate current.

Additionally, the spacer 102 can be eroded 102e as shown in the simplified FIG. 1E. This is especially problematic near the top of the spacer 102. Such erosion can result in altered transistor parametrics.

FIG. 1F is a simplified depiction of a condition that can occur using conventional processes where an overetch condition caused by ILD thinning and excessive etching occurs. For example, the described overetch can etch through the etch stop 111 into the STI 110 creating an STI overetch condition that deepens the STI recess 113. This can cause increased junction leakage that, among other problems, can lead to higher power consumption. As can be expected, these and other related conditions, are highly undesirable and moreover, increasingly difficult to address using conventional processes.

For the reasons stated above, as well as other reasons, there is a need in the art for alternative process methods capable of establishing local interconnects used in integrated circuits.

SUMMARY OF THE INVENTION

In accordance with the principles of the present invention an improved method of fabricating a local interconnect is disclosed. In one general embodiment, the present invention is directed to a method of fabricating a local interconnect. One disclosed method involves forming two separate cavities in the ILD above two electrical contacts of a transistor. A first cavity extend down to an underlying etch stop layer. The first cavity is then filled with a protective layer. The second cavity is then formed adjacent to the first cavity and extends down to expose the underlying etch stop layer. The protective layer is removed to form an expanded cavity including the first and second cavities which expose the underlying etch stop layer in the expanded cavity. The etch stop material in the expanded cavity is then removed to expose an underlying gate contact and expose one of a source or drain contact. The gate contact is then electrically connected with one of the exposed source or drain contacts to form a local interconnect.

In one embodiment, the method involves providing a substrate having a transistor with a gate and active regions that include a source and a drain. The sides of the gate further include spacers and the substrate has an etch stop layer formed over the substrate so that it covers the transistor. A dielectric layer is formed over the etch stop layer. After the substrate is provided the method forms a first cavity in the dielectric layer that exposes the etch stop layer in a first region selected from among the gate and active regions. At least a portion of the first cavity is filled with a protective cavity fill material. A second cavity is formed in the dielectric layer exposing the etch stop layer in a second region. The second region comprises one of the gate and active regions that do not form part of the first region. The protective cavity fill material is removed to form an expanded cavity comprising the first and second cavities which expose the etch stop layer in the expanded cavity. The etch stop layer in the expanded cavity is removed to expose the underlying gate contact and one of the active contacts. The expanded cavity is then filled with conductive material to electrically connect the exposed gate contact with the exposed active contact.

These and other features and advantages of the present invention are described below with reference to the drawings.

BRIEF DESCRIPTION OF THE DRAWINGS

The following detailed description will be more readily understood in conjunction with the accompanying drawings, in which:

FIGS. 1A-1F are simplified cross-section views of a semiconductor substrate that schematically illustrate aspects and shortcomings in a conventional local interconnect fabrication process.

FIGS. 2-8 are simplified cross-section views of a semiconductor substrate and schematically illustrate a local interconnect fabrication process in accordance with the principles of the invention.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various materials and method embodiments for constructing local interconnect structures will be disclosed.

As depicted in FIG. 2, the embodiments begin by first providing a suitable substrate 250. As used herein, substrate refers to a semiconductor structure. Such structures can include, for example, a silicon wafer. Such substrates 250 can be doped if needed (for example, where n-well and p-well transistors are to be formed). The depicted substrate 250 includes a typical transistor 200 formed thereon. The transistor 200 is generally isolated from other transistors and circuit structures on the wafer using isolation structures. In the depicted embodiment, such isolation is formed using STI structures 210. Also, the transistor and associated substrate are generally covered with one or more etch stop layers 211. For example, a silicon oxide (e.g., $SiO_2$ layer remaining from an earlier process step (e.g., salicide blocking layer) and a silicon nitride (e.g., $Si_3N_4$ or other related material) layer can be used to form the depicted etch stop layer 211. In one example embodiment, etch stop layer 211 is formed using a $Si_3N_4$ layer about 200 Å thick formed over a $SiO_2$ layer about 100 Å (±50 Å) thick. Methods suitable for forming such layers are well known to those of ordinary skill and need not be discussed here. Those of ordinary skill in the art will also appreciate that the etch stop layer 211 can be formed of many other materials.

Over the entire substrate is an inter-layer dielectric material 212, also known in the industry as an ILD. The ILD layer 212 is comprised of an electrically insulating material that can be deposited on the substrate surface. One common ILD material is silicon dioxide. Such silicon dioxide layers can be formed using HDPCVD (high density plasma chemical vapor deposition) techniques or other plasma assisted techniques known to those having ordinary skill in the art. Additionally, other deposition and silicon dioxide layer formation techniques can be used. Additionally, beyond silicon dioxide, combinations of silicon dioxide and other doped dielectrics (e.g., BPSG, PSG) can be used. Additionally, low-K dielectric materials or other electrically isolating materials are also used. Examples include spin-on and CVD polymeric materials based on silicon or carbon, or based on combinations of silicon and carbon. Particular low-K materials include, but are not limited to: organic thermoplastic and thermosetting polymers such as polyimides, polyarylethers, benzocyclobutenes, polyphenylquino-xalines, polyquinolines; inorganic and spin-on glass materials such as silsesquioxanes, silicates, and siloxanes; and, mixtures, or blends, of organic polymers and spin-on glasses. Further, examples of CVD low-K materials include polymers of parylene and napthalene, copolymers of parylene with polysiloxanes or teflon, and polymers of polysiloxane. Additionally, foamed polymeric materials and cured aerogels may be employed. Such materials include but are not limited to methylsilsesquioxanes and polynorbornenes and additionally polyimides (e.g., Type I and Type III polyimides). Further details of such materials can be found, for example, in U.S. Pat. Nos. 6,413,827 and 6,781,192 which are hereby incorporated by reference. This list of materials is not intended to be exhaustive but rather illustrative.

The transistor 200 can be a standard CMOS transistor or one of many other types known to those having ordinary skill in the art. The depicted transistor 200 includes a gate 201 which is typically a multi-layer structure formed of layers of silicon dioxides, polysilicon, as well as other materials. Such gate structures are well known and any suitable configuration can be employed in accordance with the principles of the invention. Such transistors 200 will be generally characterized herein as having a gate region and active regions. As referred to herein the gate region includes gate layers (which can include gate oxide layers, polysilicon layer, gate contact layers, and so on). The active regions are the source and drain regions that include appropriately doped regions and associated source and drain electrical contacts. A top gate contact 201c is typically formed as a top part of the gate. The gate contact 201c is configured to facilitate electrical contacts to the gate 201. Commonly the gate contact 201c is formed of a material having good electrical conduction properties as well as good adhesion properties to the gate materials (and any subsequently formed electrical connections). One suitable family of materials are referred to as "silicon inter-metallic materials". Examples of such materials include nickel silicides and cobalt silicides. Other suitable materials can be used. Also, the gate 201 commonly has spacers 202 arranged on the sides to enhance electrical performance. One typical spacer material is $SiO_2$.

Transistor drain 203d and source 203s regions, each including an associated electrical contacts (204s and 204d respectively) are also formed. Typically such sources and drains are formed by appropriately doping the substrate 250. Electrical connections 204s, 204d are formed to the source 203s and drain 203d respectively.

FIG. 3 depicts the substrate of FIG. 2 after further processing in accordance with the principles of the invention. A first mask layer 301 is formed on the ILD layer 212. Openings are defined in the mask 301 in accordance with the desired profile. Here, a first opening 302 is formed in the mask layer 301 to define a first cavity 303. The cavity can be formed by any of a number of processes known in the art. Examples include, but are not limited to, plasma etching and reactive ion etching (RIE). In general, any anisotropic etch process suitable for etching the ILD material in question is satisfactory. Good etch selectivity between the underlying etch stop layer 211 and the ILD 212 is also helpful, but not required to practice the invention. As depicted, the first cavity 303 is formed in a first region 311. In the depicted embodiment, the first region 311 is formed over the source 203s. Alternatively, the first region could have been formed over the drain 203d. The region 311 is configured to facilitate good electrical contact with the associated electrical contact (here, 204s). Importantly, the opening 302 could be formed over the gate 201 to define a first region wherein the first cavity extends down to the gate electrical contact 201c. Thus, the first cavity 303 can be formed over the source, gate, or drain. As can be appreciated by one of skill in the art, there are many permutations.

Referring now to FIG. 4, the substrate of FIG. 3 can now be treated with a layer of protective material 401. In one embodiment, such a protective material should be easily removable using standard process techniques and yet robust enough to protect the underlying etch stop layer from damage caused by subsequent etch steps used to remove ILD material. In one suitable example, the protective material 401 can be a layer of photoresist material or other fill material (Examples include, but are not limited to organic materials like 4-t-butoxy carbonyloxystyrene, etc.). In one embodiment, the protective material is applied as a layer of photoresist formed on the surface of the substrate so that the protective material 401 covers the bottom of the first opening 303. In one embodiment, a layer of protective material is formed over the entire surface. The protective material is removed from the surface such that a plug of protective material 401 remains in the first opening 303. The remaining portions of the protective layer are removed from the top of the ILD 212. In one embodiment such removal is facilitated by an etch process. Alternatively, other processes can be employed to form a protective layer in the first opening 303. It is intended that the protective material 401 remain only in the first opening 303 and be thick enough to protect the underlying etch stop 211 from being eroded during subsequent etch processes used to remove portions of the ILD.

FIG. 5 depicts the substrate of FIG. 4 after further processing in accordance with the principles of the invention. A second mask layer 501 is formed on the ILD layer 212. Openings are defined in the mask 501 in accordance with the desired profile. Here, an opening 502 is formed in the mask layer 501 to define a second cavity. In the depicted embodiment, the second cavity enables the potion of the ILD 212 over the gate 201 to be removed. Advantageously, the protective material 401 protects the underlying portion of the etch stop layer 211 from being removed during the ILD removal process used in forming the second cavity. As with the first cavity, the second cavity (defined by the opening 502 in the mask 501 and by the protective layer 401) can be formed by any of a number of processes known in the art. Examples include, but are not limited to, plasma etching and reactive ion etching (RIE). As before, generally any anisotropic etch process suitable for etching the ILD material is satisfactory. Also as before, good etch selectivity between the etch stop layer 211 and the ILD 212 is helpful, but not required to practice the invention.

FIG. 6 depicts the formation of the second cavity 603 is formed in a second region 611. The second cavity 603 is adjacent to the first cavity 303 which now is filled with protective material 401. In the depicted embodiment, the second region 611 is formed generally over the gate 201. The region 611 is configured to facilitate good electrical contact with the associated electrical contact (here, 201c). Importantly, the opening 502 defined by the mask 501 could have been formed over the source or drain regions to define a second region wherein the second cavity extends down to the source or drain electrical contacts. Thus, the second cavity 603 can be formed over the source, gate, or drain. As explained previously, there are many permutations.

Once the second cavity 603 is formed, the protective material 401 can be removed from the first cavity 303 to form an expanded cavity 601 that includes both the first and second cavities. Due to the presence of the protective layer 401, when the ILD layer is removed (to form the second cavity 603) the etch stop 211 is not substantially damaged by the ILD removal process (as is the case in the prior art where the etch stop is subjected to substantial and uneven erosion). Thus, the etch stop layer 211 now has a substantially uniform thickness. Additionally, in some embodiments (including the depicted embodiment) the STI structures 210 can be protected by leaving the ILD layer 212 in place over STI structures 210 thereby protecting them from damage and over etch during fabrication.

Referring now to FIG. 7, after the second cavity is formed the protective material 401 is removed. Then the etch stop layer 211 is removed from the expanded cavity 701. Typically, the etch stop layer 211 is removed using a material selective process. For example, in a process where the etch stop layer 211 is formed of a silicon nitride silicon oxide bi-layer (e.g., a silicon nitride layer with an underlying silicon oxide layer). A nitride etch process followed by an oxide etch process can be used to selectively remove the etch stop layer 211. Due to the substantially uniform thickness of the etch stop layer 211 the erosion of the spacer 202 during such etch stop removal is substantially reduced. Moreover, the over etch problems that previously damaged the gate region are now substantially reduced due to the relatively uniform thickness of the etch stop layer 211. Also, the disclosed process reduces the likelihood of over etch problems damaging the STI layers.

FIG. 8 depicts the formation of the coupling contact 801 that electrically connects the gate contact 201c to (in this case) the source contact 204s to form a local interconnect. A conductive material is introduced into the expanded cavity 701 to form the coupling contact 801. For example tungsten can be used to establish the contact 801. Aluminum, copper and other conductive materials can be used as well. In one embodiment, tungsten is deposited over the substrate. Then a polishing process (e.g., CMP) is used to remove the tungsten from the ILD 212 as well as planarize the surface. As is known to those having ordinary skill in the art, many other electrical contact fabrication processes can be used to form the contacts 801 depicted herein. Subsequently, more layers can be formed over the substrate depicted in FIG. 8.

The present invention has been particularly shown and described with respect to certain embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Further, reference in the claims to an element in the singular is not intended to mean "one and only one" unless explicitly stated, but rather, "one or more".

What is claimed is:

1. A method of forming a local interconnect for a transistor on a semiconductor substrate, the method comprising:
    providing a semiconductor substrate having formed thereon a transistor with a gate including a top gate contact in a gate region and a plurality of active regions having active contacts associated with a source and a drain of the transistor, the sides of the gate further including spacers;
    depositing, an etch stop layer over the substrate and the transistor such that it covers at least the top gate contact, the spacers, the source, and the drain of the transistor;
    forming a dielectric layer over the etch stop layer;
    anisotropically etching a first cavity in the dielectric layer, the first cavity exposing the etch stop layer inside the first cavity, the first cavity being made in a first region selected from among the gate and active regions;
    after said etching of the first cavity, filling at least a portion of the first cavity with a protective cavity fill material to cover the exposed etch stop layer;
    forming a second cavity in the dielectric layer exposing the etch stop layer in a second region selected from among gate and active regions not forming part of the first region;
    removing the protective cavity fill material from the first cavity to form an expanded cavity that includes the first cavity and the second cavity exposing the etch stop layer in the expanded cavity;
    removing the etch stop layer in the expanded cavity thereby exposing at least two of the gate contact and the active contacts; and
    filling the expanded cavity with conductive material to electrically connect the exposed contacts.

2. The method of claim 1 wherein
the first region comprises the gate region;
wherein the first opening is formed in the dielectric layer to expose a portion of the etch stop layer in the gate region;
wherein the second region comprises one of the active regions associated the source or the drain; and
wherein forming the second opening comprises removing material to expose a portion of the etch stop layer overlying one of the source and drain.

3. The method of claim 2
wherein the second region comprises an active region associated with the source; and
wherein forming the second opening comprises removing material to expose a portion of the etch stop layer overlying the source.

4. The method of claim 2
wherein the second region comprises an active region associated with the drain; and
wherein forming the second opening comprises removing material to expose a portion of the etch stop layer overlying the drain.

5. The method of claim 1 wherein
the first region comprises one of the active regions including the source and the drain;
wherein the first opening is formed in the dielectric layer to expose a portion of the etch stop layer overlying one of the source and the drain;
wherein the second region comprises the gate region; and
wherein forming the second opening comprises removing material to expose a portion of the etch stop layer overlying the gate.

6. The method of claim 5
wherein the first region comprises an active region associated with the source; and
wherein forming the first opening comprises removing material to expose a portion of the etch stop layer overlying the source.

7. The method of claim 5
wherein the first region comprises an active region associated with the drain; and
wherein forming the first opening comprises removing material to expose a portion of the etch stop layer overlying the drain.

8. A method as in claim 1 wherein the etch stop layer comprises two layers of etch stop material.

9. A method as in claim 8 wherein the two layers of etch stop material comprise a first layer of silicon oxide etch stop material formed on the substrate and a second layer of silicon nitride etch stop material formed on the first layer of silicon oxide.

10. A method as in claim 1 wherein the protective cavity fill material comprises a photoresist material.

* * * * *